United States Patent
Kim

(10) Patent No.: US 8,842,144 B2
(45) Date of Patent: Sep. 23, 2014

(54) LASER INDUCED THERMAL IMAGING APPARATUS AND METHOD FOR MANUFACTURING ORGANIC LIGHT EMITTING DIODE (OLED) DISPLAY DEVICE USING THE SAME

(75) Inventor: Won-Yong Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 1 day.

(21) Appl. No.: 13/444,813

(22) Filed: Apr. 11, 2012

(65) Prior Publication Data

US 2013/0002793 A1     Jan. 3, 2013

(30) Foreign Application Priority Data

Jun. 30, 2011 (KR) .................. 10-2011-0064981

(51) Int. Cl.
*B41J 2/435* (2006.01)
*B41J 2/47* (2006.01)
*G03C 8/00* (2006.01)
*H01L 51/00* (2006.01)

(52) U.S. Cl.
CPC ............................ *H01L 51/0013* (2013.01)
USPC ..................... 347/224; 347/225; 430/200

(58) Field of Classification Search
USPC .......... 347/224, 225, 230, 241, 256; 430/200, 430/201, 253, 270.1
See application file for complete search history.

(56) References Cited

U.S. PATENT DOCUMENTS

| | | | |
|---|---|---|---|
| 6,815,141 B2 * | 11/2004 | Fujita et al. | 430/200 |
| 7,545,403 B2 * | 6/2009 | Kang et al. | 347/241 |
| 8,087,964 B2 * | 1/2012 | Yang et al. | 445/24 |
| 8,232,038 B2 * | 7/2012 | Hirakata et al. | 430/201 |
| 2006/0227281 A1 * | 10/2006 | Kang et al. | 349/158 |
| 2008/0299496 A1 | 12/2008 | Hirakata et al. | |
| 2012/0270461 A1 * | 10/2012 | Kim et al. | 445/24 |

FOREIGN PATENT DOCUMENTS

| | | |
|---|---|---|
| JP | 2009-9935 A | 1/2009 |
| KR | 10-2004-0031276 A | 4/2004 |
| KR | 10-2007-0049006 A | 5/2007 |
| KR | 10-2007-0057066 A | 6/2007 |
| KR | 10-2007-0102299 A | 10/2007 |
| KR | 10-0782460 B | 12/2007 |
| KR | 10-0782470 B | 12/2007 |

* cited by examiner

*Primary Examiner* — Hai C Pham
(74) *Attorney, Agent, or Firm* — Christie, Parker & Hale, LLP

(57) ABSTRACT

A laser induced thermal imaging (LITI) apparatus and a method of manufacturing an organic light emitting diode (OLED) display device using the LITI apparatus. The method of manufacturing the OLED display device using the LITI apparatus includes arranging an acceptor substrate on a substrate stage; forming a donor film on the acceptor substrate; disposing a patterned mask above the acceptor substrate; irradiating the donor film with a laser beam generated by a laser beam generator through an opening of the mask; and transferring a pattern of the donor film onto the acceptor substrate. The LITI apparatus and the manufacturing method allow a transfer layer of a donor film to be easily transferred onto a substrate by scanning a laser beam without regard to a size of the substrate.

15 Claims, 11 Drawing Sheets

LASER INDUCED THERMAL IMAGING APPARATUS AND METHOD FOR MANUFACTURING ORGANIC LIGHT EMITTING DIODE (OLED) DISPLAY DEVICE USING THE SAME

CROSS-REFERENCE TO RELATED PATENT APPLICATION

This application claims priority to and the benefit of Korean Patent Application No. 10-2011-0064981, filed on Jun. 30, 2011, in the Korean Intellectual Property Office, the disclosure of which is incorporated herein in its entirety by reference.

BACKGROUND

1. Field

The following description relates to a laser induced thermal imaging apparatus that is capable of forming an organic layer by transferring a transfer layer of a donor film to a large substrate and a method for manufacturing an organic light emitting diode (OLED) display device using the laser induced thermal imaging apparatus.

2. Description of Related Art

Typically, an organic light emitting diode (OLED) display device includes an anode, a cathode, and an organic layer interposed between the anode and the cathode.

Due to their wide viewing angles, high contrast ratios, and fast response times, OLED display devices have been receiving considerable attention as next generation display technology. In addition to an organic emissive layer (EML), an OLED display device may further include at least one of a hole injection layer (HIL), a hole transport layer (HTL), an electron transport layer (ETL), and an electron injection layer (EIL) depending on whether the EML is made of a high molecular or low molecular organic material.

In order to realize a full color OLED display device, an organic layer needs to be patterned. In a low molecular OLED display device, an organic layer is patterned using a shadow mask. In a high molecular-based OLED display device, an organic layer is patterned using an ink-jet printing method or a laser induced thermal imaging (LITI) method. In particular, the LITI method is advantageous over other methods because it achieves fine patterning of an organic layer and high resolution and is suitable for large-sized displays.

SUMMARY

Aspects of embodiments of the present invention are directed toward a laser induced thermal imaging (LITI) apparatus and a method of manufacturing an organic light emitting diode (OLED) that allow easy formation of a plurality of organic layers using a laser beam generated by a laser beam generator.

According to an embodiment of the present invention, there is provided a method of manufacturing an OLED display device using an LITI method, including: arranging an acceptor substrate on a substrate stage; forming a donor film on the acceptor substrate; disposing a patterned mask above the acceptor substrate; irradiating the donor film with a laser beam generated by a laser beam generator through an opening of the mask; and transferring a pattern of the donor film onto the acceptor substrate.

In one embodiment, the donor film includes a base film, a light-to-heat conversion (LTHC) layer formed on the base film, and a transfer layer formed on the LTHC layer. Also, the transfer layer is attached onto the acceptor substrate.

In one embodiment, an optical system is disposed on a direction of travel of the laser beam and shapes the laser beam into a linear laser beam having a linear cross-sectional shape.

In one embodiment, a mirror is disposed between the optical system, and the mask and refracts the linear laser beam having the linear cross-sectional shape toward the mask.

In one embodiment, regions of emissive layers each having a corresponding color and arranged on the same line along a first direction of the acceptor substrate are simultaneously irradiated with the linear laser beam.

In one embodiment, after the irradiation with the linear laser beam, the substrate stage is moved along a second direction of the acceptor substrate.

In one embodiment, after the irradiation with the linear laser beam, the laser beam and the mask are moved along a second direction of the acceptor substrate for irradiation.

In one embodiment, an optical system is disposed on a direction of travel of the laser beam and transforms the laser beam into a shaped laser beam having a spot cross-sectional shape. Also, a galvano mirror is disposed between the optical system and the mask and changes the direction of travel of the transformed laser beam before the irradiation of the donor film.

In one embodiment, a region of each emissive layer having a corresponding color arranged on the same line along a first direction of the acceptor substrate is individually irradiated with the laser beam.

According to another embodiment of the present invention, there is provided an OLED display device that is manufactured using an LITI method, including: a laser beam generator generating a laser beam; an optical system disposed on a direction of travel of the laser beam; a substrate stage on which an acceptor substrate having mounted thereon a donor film that is irradiated with the laser beam; and a patterned mask disposed between the optical system and the acceptor substrate and above the acceptor substrate.

In one embodiment, the laser beam has a linear cross-sectional shape, and has a line-width that is at least equal to or greater than a length of the mask disposed along a first direction of the acceptor substrate.

In one embodiment, the length of the mask is sufficient to cover a pixel area on which emissive layers arranged on the same line along the first direction of the acceptor substrate will be formed.

In one embodiment, the device further includes a galvano mirror that is disposed between the optical system and the mask and changes an angle of the laser beam.

In one embodiment, the laser beam has a spot cross-sectional shape and has a size less than a length of the mask disposed along a first direction of the acceptor substrate.

In one embodiment, the laser beam has a diameter sufficient to cover one of a plurality of emissive layers arranged along the first direction and/or a second direction of the acceptor substrate.

The substrate stage is movable with respect to the laser beam and the mask.

BRIEF DESCRIPTION OF THE DRAWINGS

The above and other features and advantages of the present invention will become more apparent by describing in detail exemplary embodiments thereof with reference to the attached drawings in which:

FIG. 7A is a cross-sectional view illustrating a state in which an acceptor substrate has been prepared;

FIG. 7B is a cross-sectional view illustrating a state in which a donor film is laminated on the acceptor substrate shown in FIG. 7A;

FIG. 7C is a cross-sectional view illustrating a state in which the donor film shown in FIG. 7B has been irradiated with a laser beam;

FIG. 7D is a cross-sectional view illustrating a state in which the donor film shown in FIG. 7C has been separated;

FIG. 7E is a cross-sectional view illustrating a state in which an encapsulation layer has been formed on the acceptor substrate shown in FIG. 7D;

DETAILED DESCRIPTION

Figure 1:
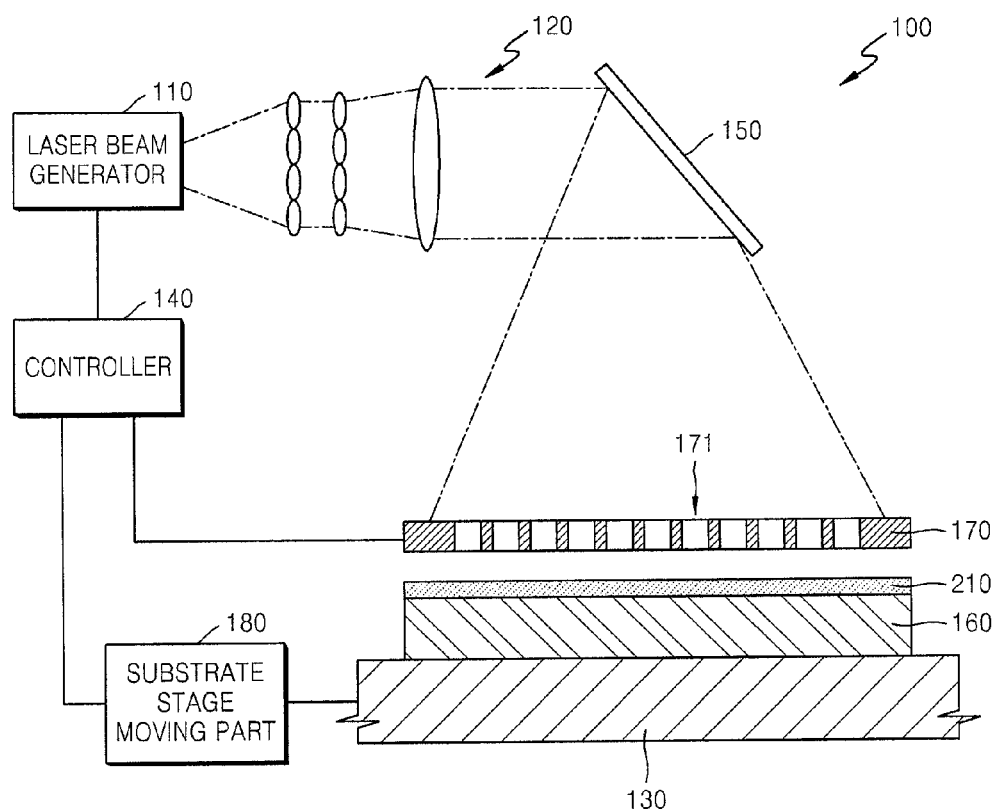
FIG. 1 is a schematic view illustrating a construction of a laser induced thermal imaging (LITI) apparatus according to an embodiment of the present invention.

As the invention allows for various changes and numerous embodiments, embodiments will be illustrated in the drawings and described in detail in the description. However, this is not intended to limit the present invention to a particular mode of practice, and it is to be appreciated that the present invention encompasses all changes, equivalents, and substitutes that do not depart from the spirit and technical scope thereof. In the description of the present invention, well-known methods will not be described in detail so as not to unnecessarily obscure the essence of the present invention.

While the terms such as "first" and "second" may be used to describe various components, such components must not be limited to the above terms. The terms are used only to distinguish one component from another.

The terms used in the present application are merely used to describe an embodiment, and are not intended to limit the present invention. Use of singular forms includes plural references as well unless expressly specified otherwise. The terms "comprising", "including", and "having" specify the presence of stated features, numbers, steps, operations, elements, components, and/or a combination thereof, but do not preclude the presence or addition of one or more other features, numbers, steps, operations, elements, components, and/or a combination thereof.

The present general inventive concept will now be described more fully with reference to the accompanying drawings, in which embodiments of the present general inventive concept are shown. An identical or corresponding component is assigned the same reference numeral and a detailed description thereof will be omitted.

FIG. 1 is a schematic view illustrating the construction of a laser induced thermal imaging (LITI) apparatus 100 according to an embodiment of the present invention.

Referring to FIG. 1, the LITI apparatus 100 includes a laser beam generator 110 for generating a laser beam, an optical system 120 for shaping the laser beam, a substrate stage 130 on which an acceptor substrate 160 is mounted, a mask 170 formed above the acceptor substrate 160, and a controller 140 for controlling the laser beam generator 110, the optical system 120, the substrate stage 130, and the mask 170.

The laser beam generator 110 may be a solid-state laser such as a ruby laser, a glass laser, a YAG laser, or a YLF laser, or may be a gas laser such as an excimer laser or a helium (He)-neon (Ne) laser.

The optical system 120 is located on a direction of travel of the laser beam generated by the laser beam generator 110. The optical system 120 includes a homogenizer for homogenizing the shape of the laser beam so as to shape the laser beam into a desired form. A mirror 150 is also located on a direction of travel of the laser beam that has passed through the optical system 120 and changes an angle of the laser beam.

The laser beam may be shaped into a desired form such as a line beam or quadrangular beam as it passes through the optical system 120. The optical system 120 may include a combination of various lens groups including a homogenizer, a focusing lens group, and a polarizer. The mirror 150 may be a galvano mirror that can change an angle linearly depending on a change in an input voltage or a reflective mirror.

The arrangement of the laser beam generator 110 and the optical system 120 is not limited thereto. For example, the laser beam generator 110 and the optical system 120 may be disposed perpendicular to the acceptor substrate 160 and the mask 170 so that the laser beam generated by the laser beam generator 110 is irradiated perpendicular to a corresponding surface of the acceptor substrate 160. In this case, the mirror 150 may not be required.

The substrate stage 130 is a substrate support for mounting the acceptor substrate 160. The substrate stage 130 can be moved by the substrate stage moving part 180 in X- and Y-directions. Since movement of the substrate stage 130 is known to a person skilled in the art, a detailed description thereof is omitted.

The controller 140 controls the laser beam generator 110, the optical system 120 including the mirror 150, and the substrate stage 130 including the substrate stage moving part 180.

The LITI apparatus 100 having the above-described construction allows the laser beam generated by the laser beam generator 110 to be shaped into a homogenized beam as the laser beam passes through the optical system 120. The homogenized laser beam is refracted vertically by the mirror 150.

The refracted laser beam selectively passes through an opening 171 of the mask 170. The mask 170 may include at least one light transmission pattern or light reflection pattern. The laser beam that has passed through the opening 171 of the mask 170 may be irradiated onto a donor film 210 attached onto the acceptor substrate 160.

Figure 2:
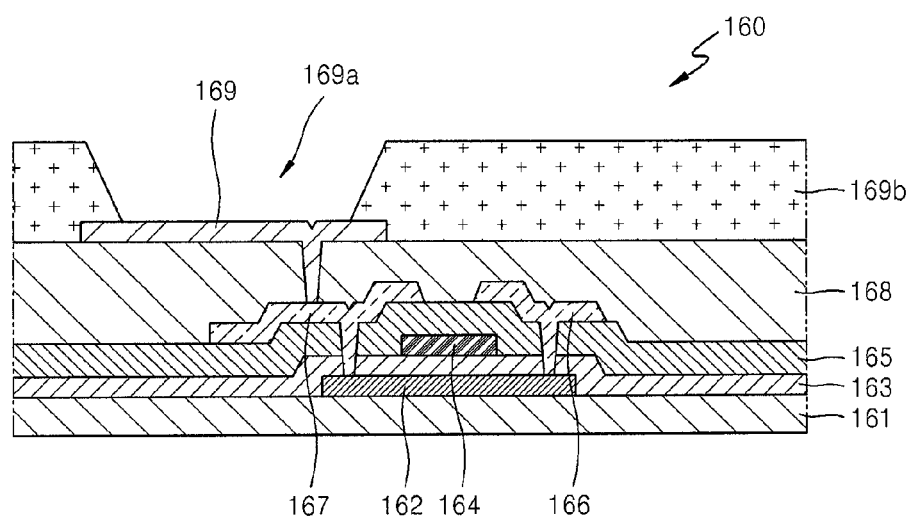
FIG. 2 is a cross-sectional view illustrating the structure of the acceptor substrate shown in FIG. 1.

FIG. 2 is a cross-sectional view illustrating the construction of an organic light emitting diode (OLED) display device that is the acceptor substrate 160 in FIG. 1.

Referring to FIG. 2, a semiconductor layer 162 is positioned on a predetermined region of a substrate 161. The semiconductor layer 162 may be an amorphous silicon layer or polycrystalline silicon layer obtained by crystallizing an amorphous silicon layer. A gate insulating layer 163 that is a first insulating layer is formed on the semiconductor layer 162. A gate electrode 164 that overlaps the semiconductor layer 162 is formed on the gate insulating layer 163. A second insulating layer 165 that covers the semiconductor layer 162 and the gate electrode 164 is formed on the gate electrode 164.

A source electrode 166 and a drain electrode 167, which penetrate the first and second insulating layers 163 and 165 and connect respectively to both ends of the semiconductor layer 162, are formed on the second insulating layer 165. The semiconductor layer 162, the gate electrode 164, and the source/drain electrodes 166 and 167 form a thin film transistor (TFT).

A third insulating layer 168 is formed on the source and drain electrodes 166 and 167 so as to cover them. The third insulating layer 168 may be a passivation layer for protecting the TFT and/or a planarization layer for reducing a step height difference in the TFT.

A pixel electrode 169 is disposed on the third insulating layer 168 so as to penetrate the third insulating layer 168 and be connected to the drain electrode 167. The pixel electrode 169 may be made of Indium Tin Oxide or Indium Zinc Oxide. A pixel defining layer (PDL) 169b is disposed on the pixel electrode 169 and has an opening portion 169a exposing a portion of the pixel electrode 169.

Figure 3:
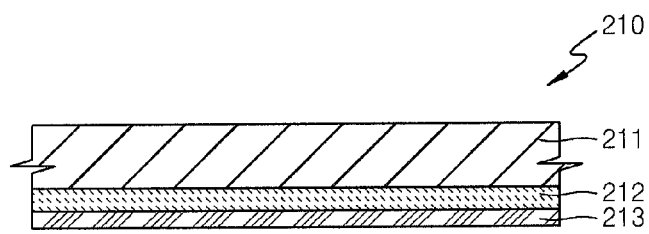
FIG. 3 is a cross-sectional view illustrating the structure of the donor film shown in FIG. 1.

FIG. 3 is a cross-sectional view illustrating the structure of the donor film 210 shown in FIG. 1. Referring to FIG. 3, the donor film 210 includes a base film 211, a light-to-heat conversion (LTHC) layer 212 formed on the base film 211, and a transfer layer 213 formed on the LTHC layer 212.

The base film 211 may be formed of a transparent high molecular organic material such as polyethylene terephthalate (PET), polyethylene naphthalate (PEN), polyethylene (PE), or polycarbonate (PC).

The LTHC layer 212 converts incident laser light to heat and may include a light-absorbing material such as aluminum oxide, aluminum sulfide, carbon black, graphite, or infrared radiation (IR) pigment.

When the acceptor substrate 160 is a substrate for an OLED display device, the transfer layer 213 may be an organic transfer layer. The organic transfer layer may be at least one selected from the group consisting of a hole injection layer (HIL), a hole transport layer (HTL), an organic emissive layer (EML), a hole blocking layer (HBL), an electron transport layer (ETL), and an electron injection layer (EIL).

Figure 4:
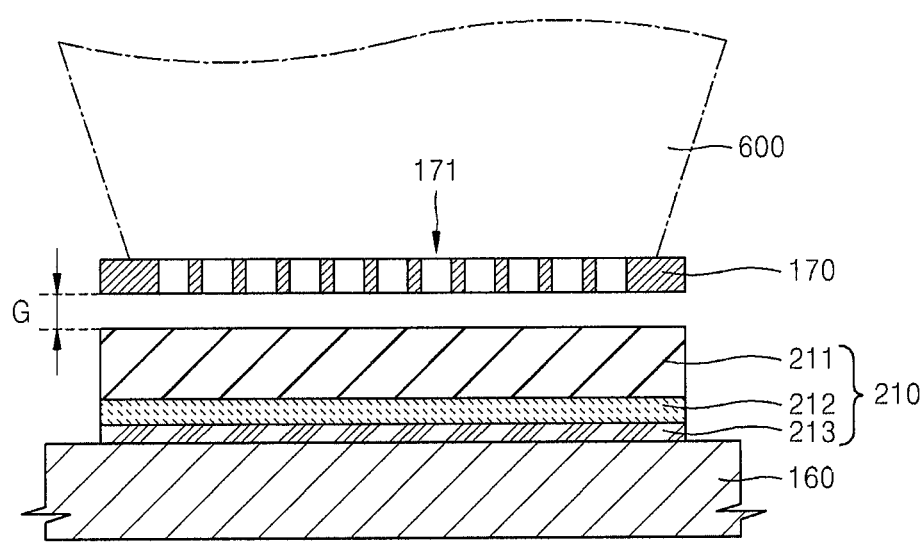
FIG. 4 is a cross-sectional view illustrating the arrangement of the acceptor substrate, the mask, and the donor film shown in FIG. 1.

FIG. 4 is a cross-sectional view illustrating the arrangement of the acceptor substrate 160, the mask 170, and the donor film 210 shown in FIG. 1.

Referring to FIG. 4, the donor film 210 is adhered to one surface of the acceptor substrate 160. The transfer layer 213 of the donor film 210 is in direct contact with and is attached to the surface of the acceptor substrate 160. The mask 170 is disposed above the acceptor substrate 160.

The mask is not directly attached to the acceptor substrate 160 but is separated therefrom by a set or predetermined distance G. The distance G is on the order of tens to hundreds of micrometers so as to reduce or minimize the diffraction of a laser beam 600 as the laser beam 600 passes through the mask 170.

The mask 170 is patterned to have a plurality of openings 171 through which the donor film 210 is selectively irradiated with the laser beam 600.

Figure 5:
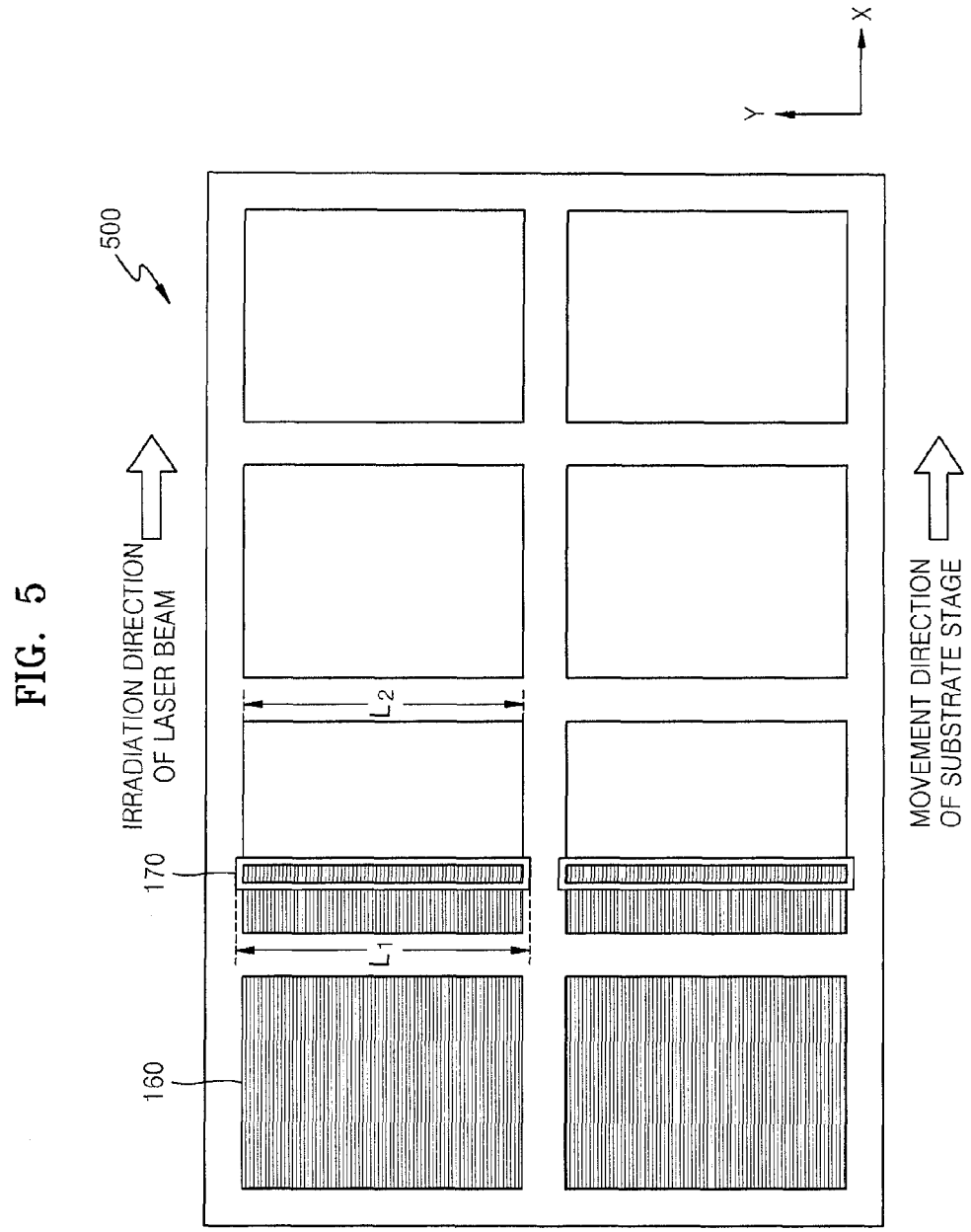
FIG. 5 is a plan view illustrating formation of layers on a mother substrate using the LITI apparatus of FIG. 1.
Figure 6:
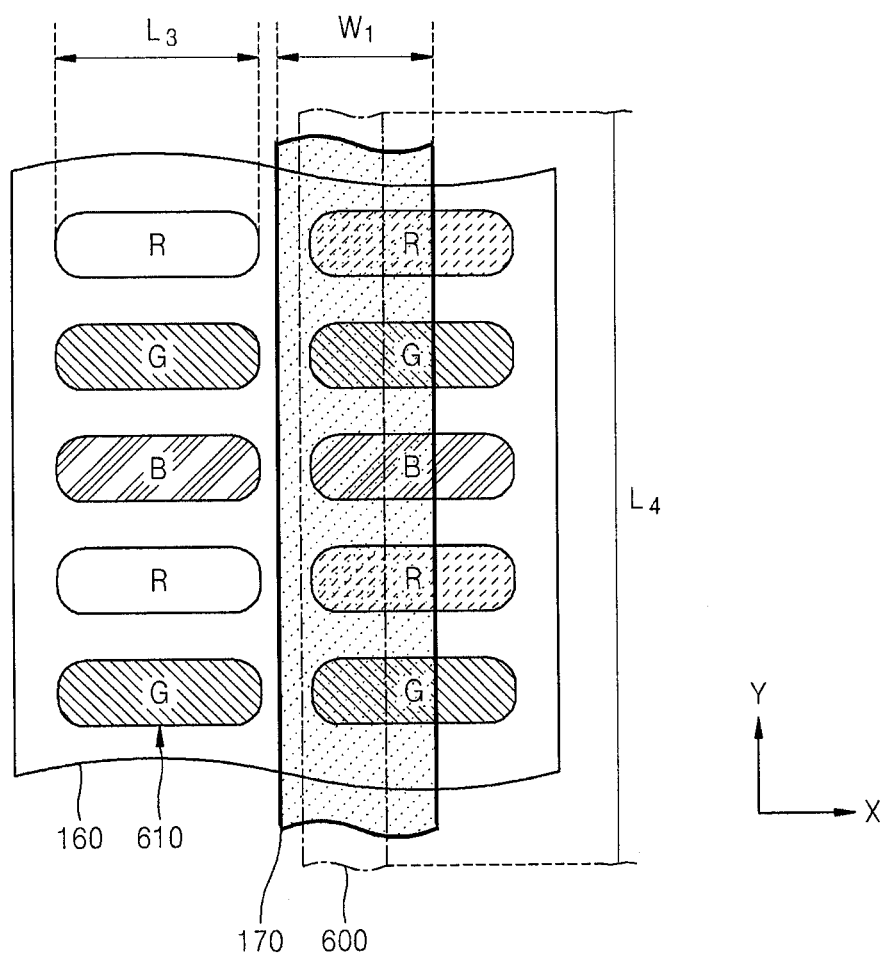
FIG. 6 is an enlarged plan view of a portion of the acceptor substrate shown in FIG. 5.

FIG. 5 is a plan view illustrating formation of layers on a mother substrate 500 using the LITI apparatus 100 of FIG. 1, and FIG. 6 is an enlarged view of a portion of the acceptor substrate 160 shown in FIG. 5.

Referring to FIGS. 5 and 6, a plurality of acceptor substrates 160 are arranged on the mother substrate 500. In the present embodiment, the mother substrate 500 is partitioned thereon with four acceptor substrates 160 along an X-direction of the mother substrate 500 and with two acceptor substrates 160 along a Y-direction. However, the number of acceptor substrates 160 on the mother substrate 500 is not limited thereto.

At least one mask 170 is disposed on the mother substrate 500. The number of masks 170 is not limited if the masks 170 are disposed on at least one acceptor substrate 160 and allow selective irradiation with the laser beam 600. A large number of masks 170 may be more advantageous in the fabrication process.

In this case, a laser beam 600 generated by the laser beam generator (110 in FIG. 1) is a linear laser beam having a size greater than a size of the mask 170.

More specifically, pixel regions 610 on which desired organic transfer layers such as a red emissive layer (R), a green emissive layer (G), and a blue emissive layer (B) are to be formed are arranged consecutively on the acceptor substrate 160. The pixel regions 610 on which the same color emissive layers R, G, or B will be formed are arranged consecutively along an X-direction of the acceptor substrate 160. The pixel regions 610 on which the red, green, blue emissive layers R, G, and B will be formed, are arranged alternately along a Y-direction of the acceptor substrate 160. In this case, the mask 170 disposed on each of the acceptor substrates 160 has a length L1 sufficient to simultaneously cover (or to overlap) the pixel regions 610 on which the red, green, blue emissive layers R, G, and B are to be formed.

The length L1 of the mask 170 may be greater than a length L2 of a long side of the acceptor substrate 160 that is a length of the acceptor substrate 160 in the Y-direction, because it is possible to simultaneously irradiate the laser beam 600 to the pixel regions 610 in the Y-direction on which corresponding red, green, blue emissive layers R, G, and B will be formed.

The laser beam 600 has a linear cross-sectional shape so as to simultaneously irradiate the pixel regions 610 corresponding to each of the red, green or blue emissive layers R, G, and B with the laser beam 600 through the mask 170.

Furthermore, a line-width L4 of the laser beam 600 may be at least equal to or greater than the length L1 of the mask 170 in order to simultaneously irradiate the pixel regions 610 in the Y-direction of the acceptor substrate 160, on which each emissive layer R, G, or B will be formed.

In this case, the length L2 refers to a size sufficient to encompass the entire display area including the pixel regions 610 where the red, green, and blue emissive layers R, G, and B are to be formed. In the context of the present embodiments, simultaneous irradiation of the laser beam 600 to the pixel regions 610 means that the donor film (210 in FIG. 1) of a different color may be prepared for each emissive layer R, G, or B so as to irradiate the desired emissive layer.

A width W1 of the mask 170 may be less than or equal to a length L3 of each pixel region 610 in the X-direction in order to achieve efficient laser beam irradiation.

A method of manufacturing an OLED display device having the above-described structure according to an embodiment of the present invention is described with reference to FIGS. 7A through 7E.

Figure 7A:
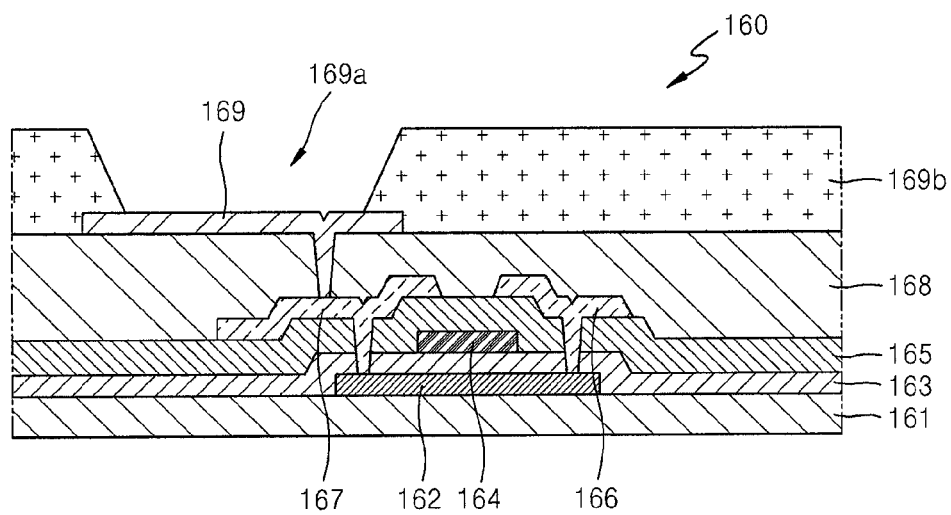
FIGS. 7A through 7E are cross-sectional views illustrating a method of manufacturing an organic light emitting diode (OLED) display device according to an embodiment of the present invention.

Referring to FIG. 7A, an acceptor substrate 160 for the OLED display device is prepared. A TFT is formed on a substrate 161 in the acceptor substrate 160. A first electrode layer 169 and a PDL 169b having an opening portion 169a that exposes a portion of the first electrode layer 169 are formed on the TFT.

Figure 7B:
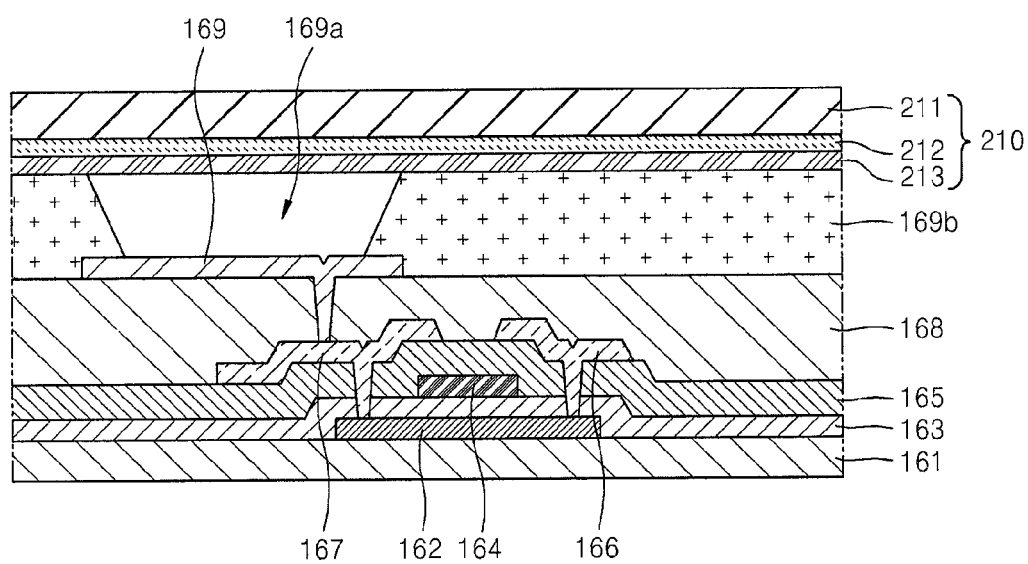

Referring to FIG. 7B, a donor film 210 is laminated on the acceptor substrate 160. In this case, a set or predetermined pressure is applied to the donor film 210 because improving an adhesion between the acceptor substrate 160 and the donor film 210 increases transfer efficiency during a subsequent transfer process.

Figure 7C:
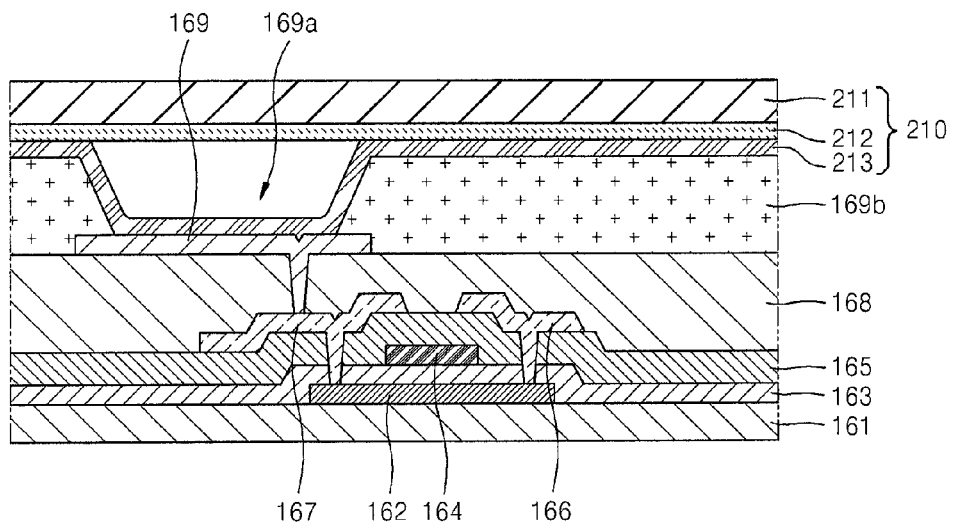

Next, referring to FIG. 7C, when the donor film 210 is laminated on the acceptor substrate 160, only a portion of donor film 210 with a transfer layer 213 to be transferred is locally irradiated with a laser beam.

Upon being irradiated by the laser beam, an LTHC layer 212 expands towards the acceptor substrate 160 together with the transfer layer 213, thus allowing a portion 213a of the transfer layer 213 corresponding to the irradiated portion of the donor film 210 to be separated from the donor film 210 and be transferred onto the acceptor substrate 160.

Figure 7D:
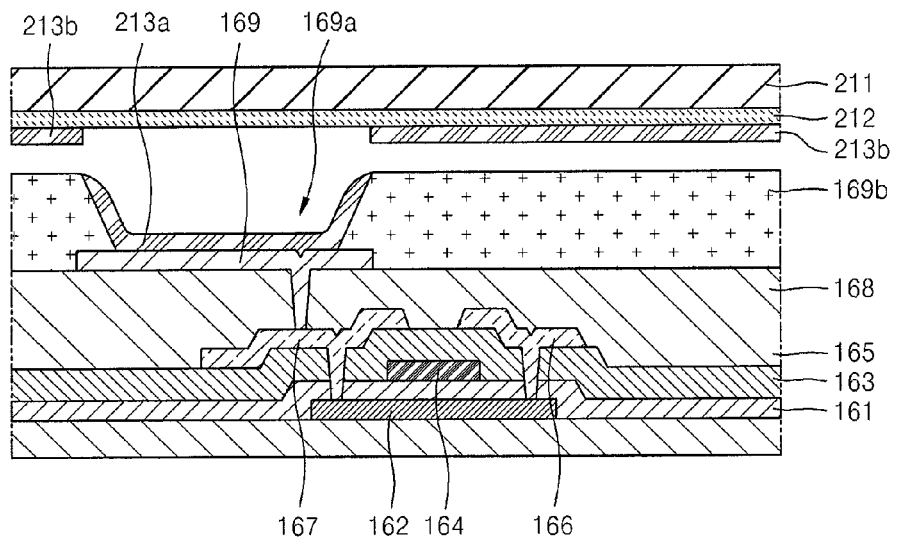

Referring to FIG. 7D, when the portion 213a of the transfer layer 213 is transferred onto the acceptor substrate 160, the donor film 210 is separated from the acceptor substrate 160. Here, the portion 213a of the transfer layer 213 is transferred onto at least a portion of the PDL 169b and the opening portion 169a in the acceptor substrate 160. In other words, only the portion 213a of the transfer layer 213 corresponding to the irradiated region is transferred onto the acceptor substrate 160 while the remaining portion 213b resides on the donor film 210.

Figure 7E:
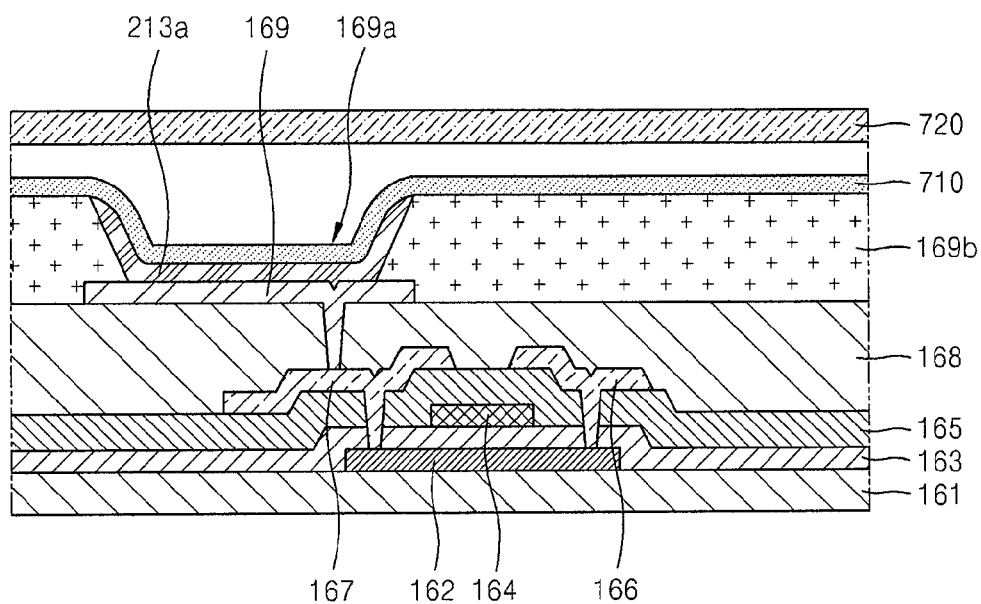

Referring to FIG. 7E, after transferring the portion 213a of the transfer layer 213 onto the acceptor substrate 160, a second electrode layer 710 is formed on the portion 213a of the transfer layer 213 acting as an emissive layer, and an encapsulation layer 720 is formed above the second electrode layer 710 so as to protect the OLED display device.

A process of transferring the transfer layer 213 of the donor film 210 onto the acceptor substrate 160 using a linear laser beam is described in more detail.

Referring to FIGS. 1 through 6, the mother substrate 500 is partitioned into a plurality of acceptor substrates 160 arranged thereon. The donor film 210 is attached onto the one surface of the acceptor substrate 160. The mask 170 is disposed at a set or predetermined distance G on the order of tens to hundreds of micrometers above the acceptor substrate 160.

The laser beam 600 generated by the laser beam generator 110 is transformed to a homogenized laser beam having a linear cross-sectional shape as it passes through the optical system 120 such as a homogenizer. The direction of travel of the laser beam 600 is changed by the reflective mirror 150 so that the laser beam 600 selectively passes through the opening 171 of the mask 170. The laser beam 600 is then irradiated onto the donor film 210.

In this case, the mask 170 is disposed in the direction of the long side of the acceptor substrate 160 (the Y-direction). The laser beam 600 is in linear form and selectively passes through the opening 171 of the mask and is irradiated onto the donor film 210.

The length L1 of the mask 170 is sufficient to cover the length L2 of the acceptor substrate 160 in the Y-direction, and the line-width L4 of the linear laser beam 600 is greater than or equal to the length L1 of the mask 170. This configuration allows for simultaneous irradiation of the laser beam 600 to the pixel regions 610 arranged in the Y-direction of the acceptor substrate 160 where corresponding red, green, or blue emissive layers R, G, and B are formed.

After completing laser beam irradiation on the same line of the acceptor substrate 160 in the Y-direction, the substrate stage 130 for supporting the acceptor substrate 160 is moved by the substrate stage moving part 180 in the X-direction.

After moving the substrate stage 130, other pixel regions 610 arranged in the Y-direction and having desired emissive layers R, G, or B to be formed are irradiated with the linear laser beam 600 on the same line of the acceptor substrate 160 in the Y-direction in order to form the desired emissive layers R, G, or B.

As described above, after simultaneous irradiation of the pixel regions 610 corresponding to desired emissive layers R, G, or B with the linear laser beam 600, the substrate stage 130 moves along the X-direction of the acceptor substrate 160. By repeating the above irradiation process, the process of transferring emissive layers (R, G, and B) onto the acceptor substrate 160 is completed.

Alternatively, with the substrate stage 130 fixed, the pixel regions 610 corresponding to desired emissive layers R, G, and B may be simultaneously irradiated with the linear laser beam 600. Thereafter, the laser beam 600 and the mask 170 may be moved by the controller 140 along the X-direction so as to irradiate the donor film 210 with the laser beam 600.

Figure 8:
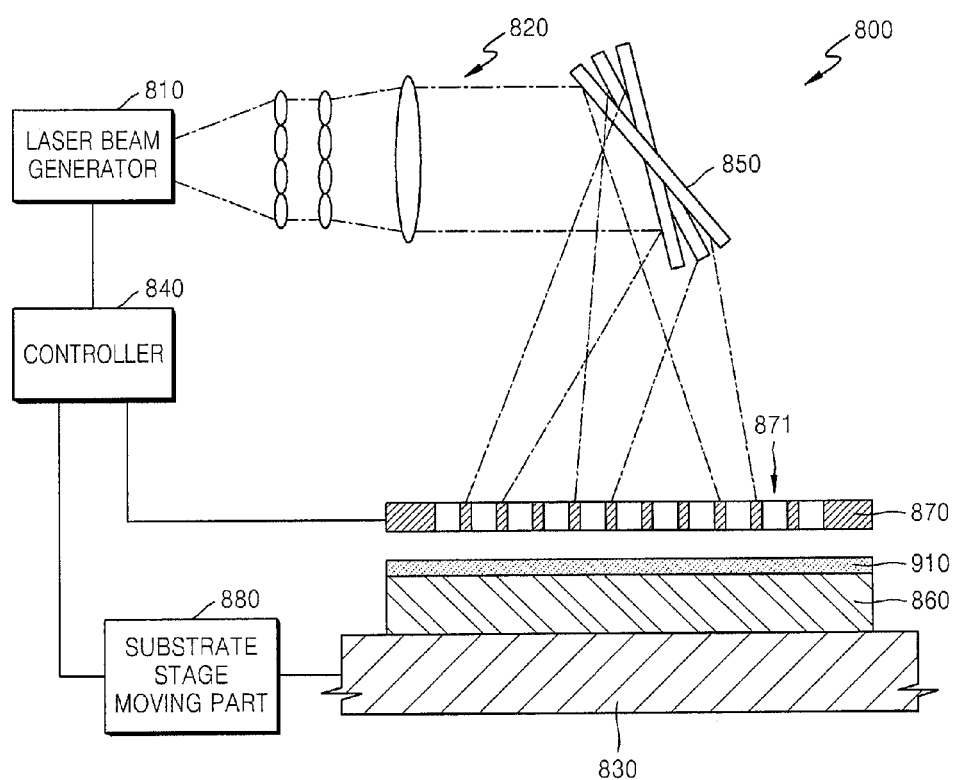
FIG. 8 is a schematic view illustrating the construction of an LITI apparatus according to another embodiment of the present invention.

FIG. 8 is a schematic view illustrating the construction of an LITI apparatus 800 according to another embodiment of the present invention.

Referring to FIG. 8, the LITI apparatus 800 includes a laser beam generator 810, an optical system 820, a substrate stage 830 on which the acceptor 860, a mask 870 disposed above the acceptor substrate 860, and a controller 840 for controlling the laser beam generator 810, the optical system 820, the substrate stage 830, and the mask 870.

The LITI apparatus 800 further includes a mirror 850 that is located on a direction of travel of the laser beam that has passed through the optical system 820 and changes an angle of the laser beam so that the laser beam can selectively pass through an opening 871 of the mask 870. The mirror 850 includes a galvano mirror.

Figure 9:
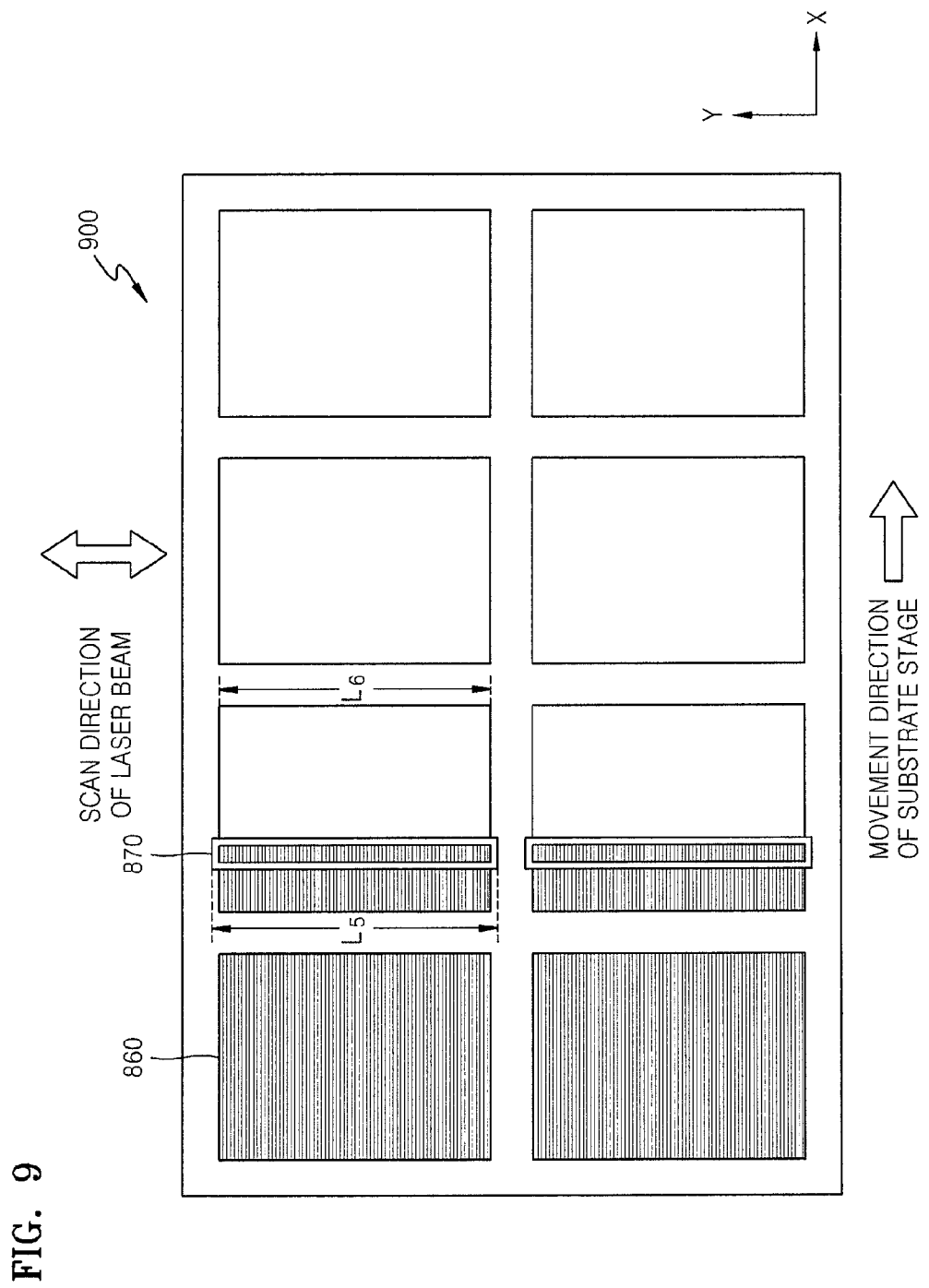
FIG. 9 is a plan view illustrating formation of layers on a mother substrate using the LITI apparatus of FIG. 8.
Figure 10:
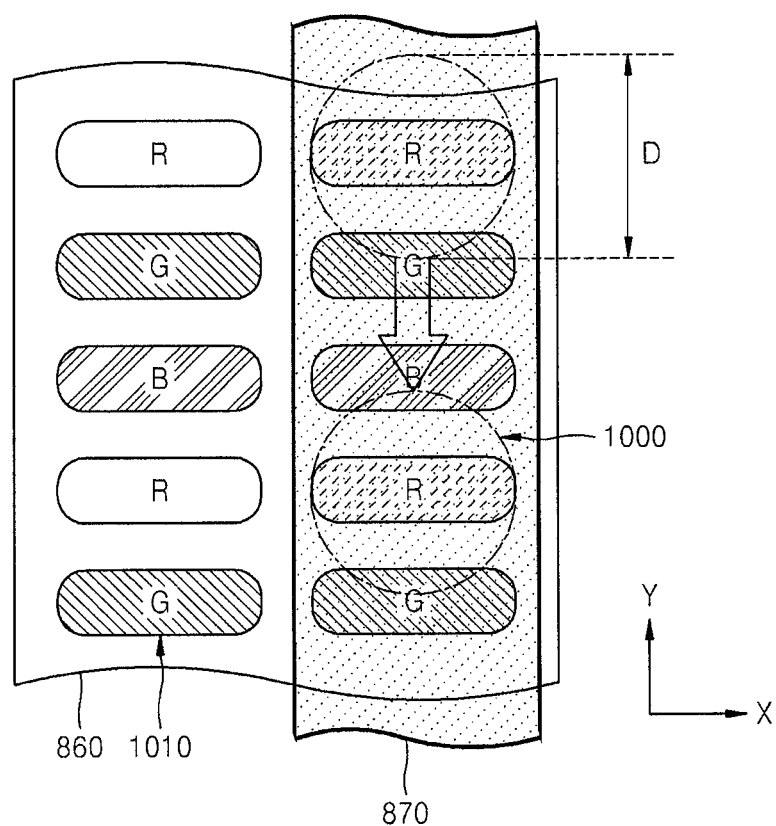
FIG. 10 is an enlarged plan view of a portion of the acceptor substrate shown in FIG. 9.

FIG. 9 is a plan view illustrating formation of layers on a mother substrate 900 using the LITI apparatus 800 of FIG. 8, and FIG. 10 is an enlarged view of a portion of the acceptor substrate 860 shown in FIG. 9.

Referring to FIGS. 9 and 10, in the present embodiment, a plurality of acceptor substrates are aligned on the mother substrate 900. Four acceptor substrates 860 are aligned in the X-direction of the mother substrate 900 and two acceptor substrates 860 are aligned in the Y-direction of the mother substrate 900. At least one mask 870 is disposed on the mother substrate 900.

In this case, a laser beam generated by the laser beam generator (810 in FIG. 8) has a size less than a size of the mask 870.

In detail, pixel regions 1010 on which organic transfer layers such as a red emissive layer (R), a green emissive layer (G), and a blue emissive layer (B) are to be formed are arranged consecutively on the acceptor substrate 860. The pixel regions 1010 on which the same color emissive layers R, G, or B will be formed are arranged consecutively along an X-direction of the acceptor substrate 860. The pixel regions 1010 on which the red, green, blue emissive layers R, G, and B will be formed are arranged alternately along a Y-direction of the acceptor substrate 860.

In this case, the mask 870 disposed on each of the acceptor substrates 860 has a length L5 sufficient to simultaneously cover the pixel regions 1010 on which the red, green, blue emissive layers R, G, and B are to be formed. The length L5 of the mask 870 is greater than a length L6 of a long side of the acceptor substrate 860 that is a length of the acceptor substrate 860 in the Y-direction.

In this case, a laser beam 1000 has a spot cross-sectional shape so as to independently irradiate each pixel region 1010, on which one of corresponding red, green, or blue emissive layers R, G, or B will be formed, with the laser beam 1000 through the mask 870.

Thus, the laser beam 1000 has a diameter D that is sufficient to cover each pixel region 1010 in which one of corresponding emissive layers R, G, or B will be formed.

A process of transferring a donor film 910 onto the acceptor substrate 860 will now be described with reference to FIGS. 8 through 10.

Referring to FIGS. 8 through 10, the laser beam 1000 generated by the laser beam generator 810 is transformed to a spot shape laser beam as it passes through the optical system 820. The direction of travel of the laser beam 1000 is changed by the galvano mirror 850 so that the laser beam 1000 selectively passes through the opening 871 of the mask 870. The laser beam 1000 is then irradiated onto each position of the donor film 210.

In this case, when the galvano mirror 850 is rotated by the controller 840 at a set or predetermined angle, a corresponding opening 871 of the mask 870 is irradiated with the laser beam 1000 so as to transfer a pixel region 1010 corresponding to one of desired emissive layers R, G, or B.

In this case, the mask 870 is disposed in the direction of the long side of the acceptor substrate 860 (the Y-direction). Each pixel region 1010 in the Y-direction of the acceptor substrate 860 on which one of desired emissive layers R, G, or B is to be formed is irradiated with the laser beam 1000. After the irradiation, another neighboring pixel region 1010 corresponding to another emissive layer R, G, or B having the same color is irradiated with the laser beam 1000.

In more detail and according to one embodiment, after completing laser beam irradiation on the same line of the acceptor substrate 860 in the Y-direction, the substrate stage 830 for supporting the acceptor substrate 860 is moved by a substrate stage moving part 880 in the X-direction.

After moving the substrate stage 830, each pixel region 1010 arranged in the Y-direction and having a desired emissive layer R, G, or B to be formed is independently irradiated with the spot shape laser beam 1000 on the same line of the acceptor substrate 860 in order to form the desired emissive layers R, G, or B.

As described above, following individual irradiation of the pixel region 1010 corresponding to one of the desired emissive layers R, G, or B arranged on the same line in the Y-direction of the acceptor substrate 860 with the spot shape laser beam 1000, the substrate stage 830 moves along the X-direction of the acceptor substrate 860 intersecting the Y-direction. By repeating the above irradiation process, the process of transferring emissive layers (R, G, and B) onto the acceptor substrate 860 is completed.

Alternatively and according to another embodiment, with the substrate stage 830 fixed, the pixel region 1010 corresponding to each of desired emissive layers R, G, or B may be individually irradiated with the spot shape laser beam 1000. Thereafter, the laser beam 1000 and the mask 870 may be moved by the controller 840 along the X-direction so as to irradiate the donor film 910 with the laser beam 1000.

As described above, an LITI apparatus and a method of manufacturing an OLED display device using the LITI apparatus according to embodiments of the present invention allow a transfer layer of a donor film to be easily transferred onto a substrate by scanning a laser beam without regard to a size of the substrate.

While the present invention has been particularly shown and described with reference to exemplary embodiments thereof, it will be understood by those of ordinary skill in the art that various changes in form and details may be made therein without departing from the spirit and scope of the present invention as defined by the following claims, with equivalents of the claims to be included therein.

What is claimed is:

1. A method of manufacturing an organic light emitting diode (OLED) display device using a laser induced thermal imaging method, the method comprising:
   arranging an acceptor substrate on a substrate stage;
   forming a donor film on the acceptor substrate;
   disposing a patterned mask above the acceptor substrate;
   irradiating the donor film with a laser beam generated by a laser beam generator through an opening of the patterned mask; and
   transferring a pattern of the donor film onto the acceptor substrate,
   wherein the donor film comprises a base film, a light-to-heat conversion (LTHC) layer formed on the base film, and a transfer layer formed on the LTHC layer, and
   wherein the transfer layer is in direct contact and is attached to the acceptor substrate,
   wherein a width of the patterned mask is less than or equal to a length of each pixel region on which emissive layers are formed and arranged along a second direction of the acceptor substrate, and
   wherein the length of the patterned mask is sufficient to cover a length of the acceptor substrate, in a first direction of the acceptor substrate, on which the emissive layers are formed and arranged on the same line along the first direction of the acceptor substrate.

2. The method of claim 1, wherein an optical system is disposed on a direction of travel of the laser beam and shapes the laser beam into a linear laser beam having a linear cross-sectional shape.

3. The method of claim 2, wherein a mirror is further disposed between the optical system and the patterned mask, and wherein the linear laser beam is refracted by the mirror and irradiated toward the patterned mask.

4. The method of claim 2, wherein each pixel region has a corresponding color and the pixel regions, arranged on the same line along the first direction of the acceptor substrate, are simultaneously irradiated with the linear laser beam.

5. The method of claim 4, wherein after the irradiating of the donor film with the linear laser beam, the substrate stage is moved along the second direction of the acceptor substrate.

6. The method of claim 4, wherein after the irradiating of the donor film with the linear laser beam, the laser beam and the patterned mask are moved along the second direction of the acceptor substrate for irradiation.

7. The method of claim 1, wherein an optical system is disposed on a direction of travel of the laser beam and shapes the laser beam into a shaped laser beam having a spot cross-sectional form, and
   wherein a galvano mirror is disposed between the optical system and the patterned mask and changes a direction of travel of the shaped laser beam before the irradiating of the donor film by the shaped laser beam.

8. The method of claim 7, wherein each pixel region has a corresponding color and the pixel regions are, arranged on the same line along the first direction of the acceptor substrate, are individually irradiated with the laser beam.

9. The method of claim 8, wherein after the irradiating of the donor film with the shaped laser beam, the substrate stage is moved along the second direction of the acceptor substrate intersecting the first direction.

10. The method of claim 8, wherein after the irradiating of the donor film with the shaped laser beam, the laser beam and the patterned mask are moved for irradiation along the second direction of the acceptor substrate intersecting the first direction.

11. A laser induced thermal imaging apparatus, the apparatus comprising:
- a laser beam generator for generating a laser beam;
- an optical system disposed on a direction of travel of the laser beam;
- a substrate stage on which an acceptor substrate having mounted thereon a donor film configured to be irradiated with the laser beam; and
    - a patterned mask disposed between the optical system and the acceptor substrate and above the acceptor substrate,
- wherein the donor film comprises a base film, a light-to-heat conversion (LTHC) layer formed on the base film, and a transfer layer formed on the LTHC layer, and
- wherein the transfer layer is in direct contact and is attached to the acceptor substrate,
- wherein a width of the patterned mask is less than or equal to a length of each pixel region on which emissive layers are formed and arranged along a second direction of the acceptor substrate, and
- wherein the length of the patterned mask is sufficient to cover a length of the acceptor substrate, in a first direction of the acceptor substrate, on which the emissive layers are formed and arranged on the same line along the first direction of the acceptor substrate.

12. The apparatus of claim 11, wherein the laser beam has a linear cross-sectional shape, and
- wherein the laser beam has a line-width that is at least equal to or greater than a length of the patterned mask disposed along the first direction of the acceptor substrate.

13. The apparatus of claim 11, further comprising a galvano mirror disposed between the optical system and the patterned mask and configured to change an angle of the laser beam.

14. The apparatus of claim 13, wherein the laser beam has a spot cross-sectional shape, and
- wherein the laser beam has a size less than a length of the patterned mask disposed along the first direction of the acceptor substrate.

15. The apparatus of claim 11, wherein the substrate stage is movable with respect to the laser beam and the patterned mask.

* * * * *